United States Patent [19]
Watanabe

[11] Patent Number: 5,319,798
[45] Date of Patent: Jun. 7, 1994

[54] RADIO TRANSCEIVER HAVING PLL SYNTHESIZER

[75] Inventor: Nozomu Watanabe, Tokyo, Japan

[73] Assignee: NEC Corporation, Japan

[21] Appl. No.: 785,548

[22] Filed: Oct. 31, 1991

[30] Foreign Application Priority Data

Oct. 31, 1990 [JP] Japan .................................. 2-293963

[51] Int. Cl.⁵ ............................................ H04B 1/40
[52] U.S. Cl. .......................................... 455/76; 455/77;
455/78; 455/87; 370/95.3; 331/25; 331/64
[58] Field of Search ................. 455/76, 259, 260, 265,
455/264, 85–87, 165.1, 180.3, 183.1, 77, 78;
331/17, 25, 64; 370/95.1, 95.3

[56] References Cited

U.S. PATENT DOCUMENTS

| 3,932,821 | 1/1976 | McClaskey | 331/25 |
| 3,988,696 | 10/1976 | Sharpe | 331/64 |
| 4,499,434 | 2/1985 | Thompson | 455/9 |
| 4,777,655 | 10/1988 | Numata et al. | 455/76 |
| 5,055,802 | 10/1991 | Hietala et al. | 455/76 |

FOREIGN PATENT DOCUMENTS 0380946 12/1990 European Pat. Off. .

OTHER PUBLICATIONS

*IEEE Transactions*, "A New Design Technique for Digital PLL Synthesizers"; Breeze; Feb. 1978, pp. 24–33.

*New Electron*, "Developments in Phase Locked Loop Tuning Systems"; Yeung; vol. 12, No. 3; Feb. 6, 1979; pp. 65–67.

Primary Examiner—Reinhard J. Eisenzopf
Assistant Examiner—Andrew Faile
Attorney, Agent, or Firm—Ostrolenk, Faber, Gerb & Soffen

[57] ABSTRACT

A radio transceiver including a PLL synthesizer and is adaptable to a TDMA system in which the frequency of a radio frequency carrier is switched frequently at high speed. When an unlock alarm of the PLL synthesizer is used as one of the device alarms, the unlock alarm to be generated in an initial unlock period which is usually provided every switching of an output frequency of the PLL synthesizer is not used as one of the device alarms. The prohibition of generation of this unlock alarm is started in synchronism with a frequency control signal supplied from a control portion of the radio transceiver to a frequency divider of the PLL synthesizer for switching the carrier frequency and is limited to an OFF period of the carrier transmitting/receiving period.

21 Claims, 5 Drawing Sheets

RADIO TRANSCEIVER HAVING PLL SYNTHESIZER

BACKGROUND OF THE INVENTION

The present invention relates to a radio transmitter/receiver (referred to as "transceiver", hereinafter) having an unlock alarm of a frequency synthesizer including a PLL (phase locked loop) as one of the device alarms and, particularly, to such a transceiver suitable for use in a radio communication system such as a time division multiple access (TDMA) communications system which requires high-speed and frequent switching between a receiving state and a transmitting state.

DESCRIPTION OF THE PRIOR ART

The TDMA communications system is employed in many radio communications systems including a digital cellular telephone system according to the Groupe Speciale Mobile (GSM) standard. In such a transceiver of the TDMA communications system, a single PLL frequency synthesizer is shared by a receiving portion and a transmitting portion of the transceiver as a local frequency source, since there is no simultaneous transmission and receiving. In such a digital cellular telephone system which requires highly precise frequency setting and reduction of size, the shared use of the PLL frequency synthesizer is unavoidable. Further, in the TDMA communications system such as a digital cellular telephone system, it is necessary, in order to maintain a high quality of communication, to switch transmitting and receiving frequencies, that is, to perform frequency hopping. In order to satisfy this requirement, the PLL frequency synthesizer constituting the local frequency signal source should be durable against high-speed, highly frequent frequency switching.

In order to operate the PLL frequency synthesizer normally, the PLL frequency synthesizer must be kept phase locked. Therefore, any out-of-phase condition, that is, an unlock condition, must be detected and corrected quickly. To this end, the PLL frequency synthesizer usually includes an unlock detection circuit for detecting the unlock condition. On the other hand, a PLL frequency synthesizer to be used in a transceiver performing the frequency hopping usually becomes unlocked immediately after every frequency switching, producing an unlock alarm which is decided by the transceiver as an abnormal operation. Since such initial unlock occurs in the PLL frequency synthesizer so long as the associated transceiver performs the frequency hopping, it is impossible to distinguish an unlock which is caused by an abnormality and is to be corrected from such initial unlock which occurs in normal operation of the device.

SUMMARY OF THE INVENTION

Therefore, an object of the present invention is to provide a transceiver of such a TDMA communications system which requires a frequent switching of a transmitting signal and receiving signal and whose transmitting and receiving portions share a single PLL frequency synthesizer as their local frequency signal sources, and in which any unlock alarm is not produced for a predetermined time period immediately after a frequency switching even if there is an unlock condition of the PLL frequency synthesizer within the time period.

Another object of the present invention is to provide a PLL frequency synthesizer in which a production of an unlock alarm is prevented within a predetermined time period immediately after the frequency switching.

A PLL frequency synthesizer which features the present invention is suitable for use in a transceiver of a communications system such as a TDMA communications system, in which timing of transmission and reception are inconsistent and high-speed and frequent switching of frequencies between transmission and reception is required.

The PLL synthesizer comprises a frequency divider for dividing an output of a voltage controlled oscillator (VCO), a phase detector for comparing an output of the frequency divider as a comparison signal with a reference signal from a reference oscillator to produce a phase difference signal and a PLL oscillator for controlling an oscillation frequency of the VCO according to the phase difference signal. The frequency switching of the PLL frequency synthesizer is started upon an application of a frequency control signal indicating a change of frequency dividing data to the frequency divider. The phase detector produces not only the phase difference signal but also a phase difference detection signal corresponding to the phase difference signal, when there is such phase difference, that is, it is in an unlock state. In response to the phase difference detection signal, an audible and/or visible alarm is displayed on an alarm display portion of the transceiver. The PLL frequency synthesizer according to the present invention includes an unlock alarm prohibition circuit for prohibiting a response of the alarm display portion to the phase difference detection signal for a predetermined time period from the start of the detection signal.

An output frequency of the PLL frequency synthesizer is switched every time a dividing data signal and a strobe signal is supplied following the dividing data signal and there is produced a very brief phase unlock state in a transient time immediately after every frequency switching. However, the unlock alarm prohibition circuit prohibits production of unlock alarm in at least this transient time. Therefore, when the PLL frequency synthesizer according to the present invention is used in a transceiver having high frequency switching rate, the problem that an unlock alarm is produced every signal frequency switching can be avoided.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENT

Figure 1:
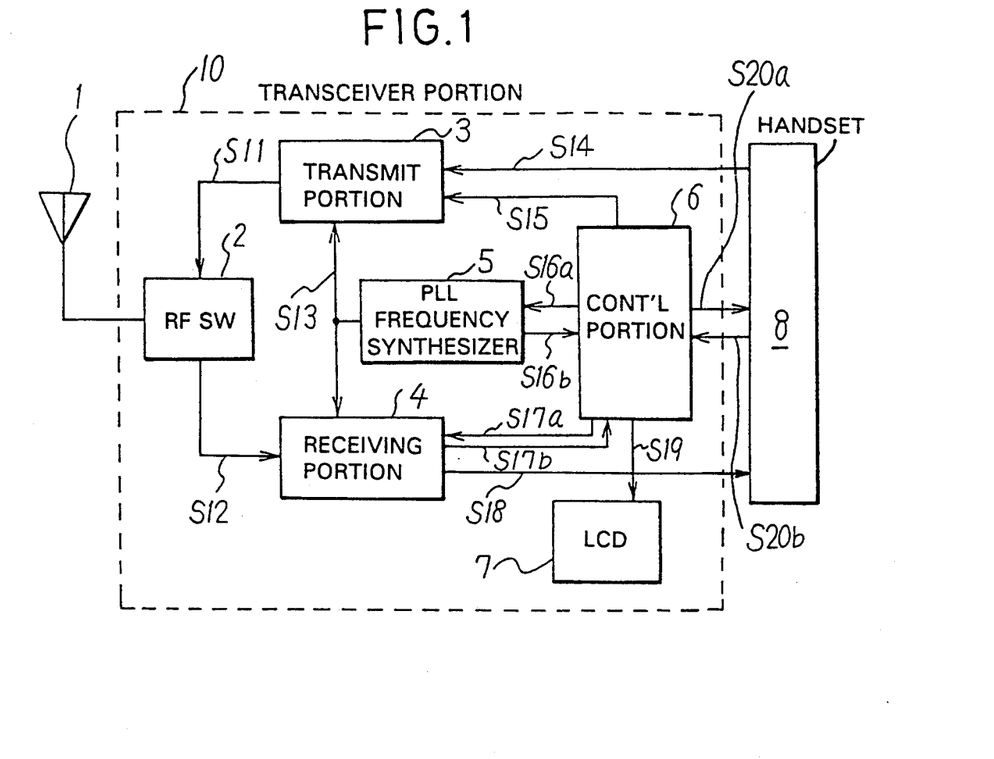
FIG. 1 is a block diagram of an example of a TDMA communication transceiver adopting the GSM standards to which transceiver the present invention is applied.

Referring to FIG. 1, a portable telephone for use in a digital cellular telephone system according to the GSM standards, to which telephone the present invention is applied, comprises an antenna 1 for transmitting a transmitting signal S11 to a base station (not shown), receiving a radio frequency signal from the base station and supplying it to a receiving portion 4 as a receiving signal S12. The telephone also comprises transceiver portion 10 for producing the transmitting signal S11 by frequency-converting and amplifying an input communications signal S14 and for converting the receiving signal S12 into a communications signal S18 and a handset 8 for producing the communications signal S14 and receiving the communications signal S18. It should be noted that control signals S20a and S20b are exchanged between the transceiver portion 10 and the handset 8 for call connection.

The transceiver portion 10 further comprises a RF switch 2 of SPDT type having a common terminal connected to the antenna 1, a transmitting portion 3 responsive to the control signal S15 and to the communication signal S14 from the handset 8 to produce the transmitting signal S11 and sending the signal S11 through a first switch terminal of the RF switch 2 to the antenna 1. The receiving portion 4 receives the receiving signal S12 supplied from the antenna 1 through a second switch terminal of the RF switch 2, producing a control signal S17b and supplying a communications signal S18 to the handset 8. A PLL frequency synthesizer 5 supplies a local oscillating signal S13 to the transmitting portion 3 and to the receiving portion 4 in response to a frequency control signal S16a. A control portion 6 controls the transmitting portion 4, the receiving portion 4, the PLL frequency synthesizer 5 and the handset 8 by sending to them the control signals S15, S17a, S16a and S20a, respectively. Based on the signals S20b and S17b, the control portion 6 controls frequency selection between the transmitting signal S11 and the receiving signal S12, an ON/OFF control of the transmitting carrier and a call connection to the base station. The transceiver portion 10 further comprises an LCD (liquid crystal display) portion 7 for visually displaying various indications including abnormality of operation of the transceiver 10, according to an instruction of a control signal S19 from the control portion 6. Although the transceiver portion 10 includes, in addition to the circuits shown, other components such as a power source package, these components are not shown since they are not a part of the present invention.

The PLL frequency synthesizer 5 shown in FIG. 1 supplies an unlock alarm detected by an unlock alarm generating means included therein to the control portion 6 in the form of a control signal S16b. The control portion 6 processes various signals including abnormality alarms from other circuits and supplies a control signal S19 to the LCD portion 7 to display alarm conditions. The PLL frequency synthesizer 5 responds to the frequency control signal S16a from the control portion 6 to switch frequency and prohibits a transmission of the unlock alarm (control signal S16b) during a transient time until a phase locked state is recovered under control of an unlock alarm prohibition means to be described later. Therefore, during the transient time, there is no unlock alarm signal supplied to the control portion 6, so that an erroneous unlock alarm is not displayed on the LCD portion 7.

Figure 2:
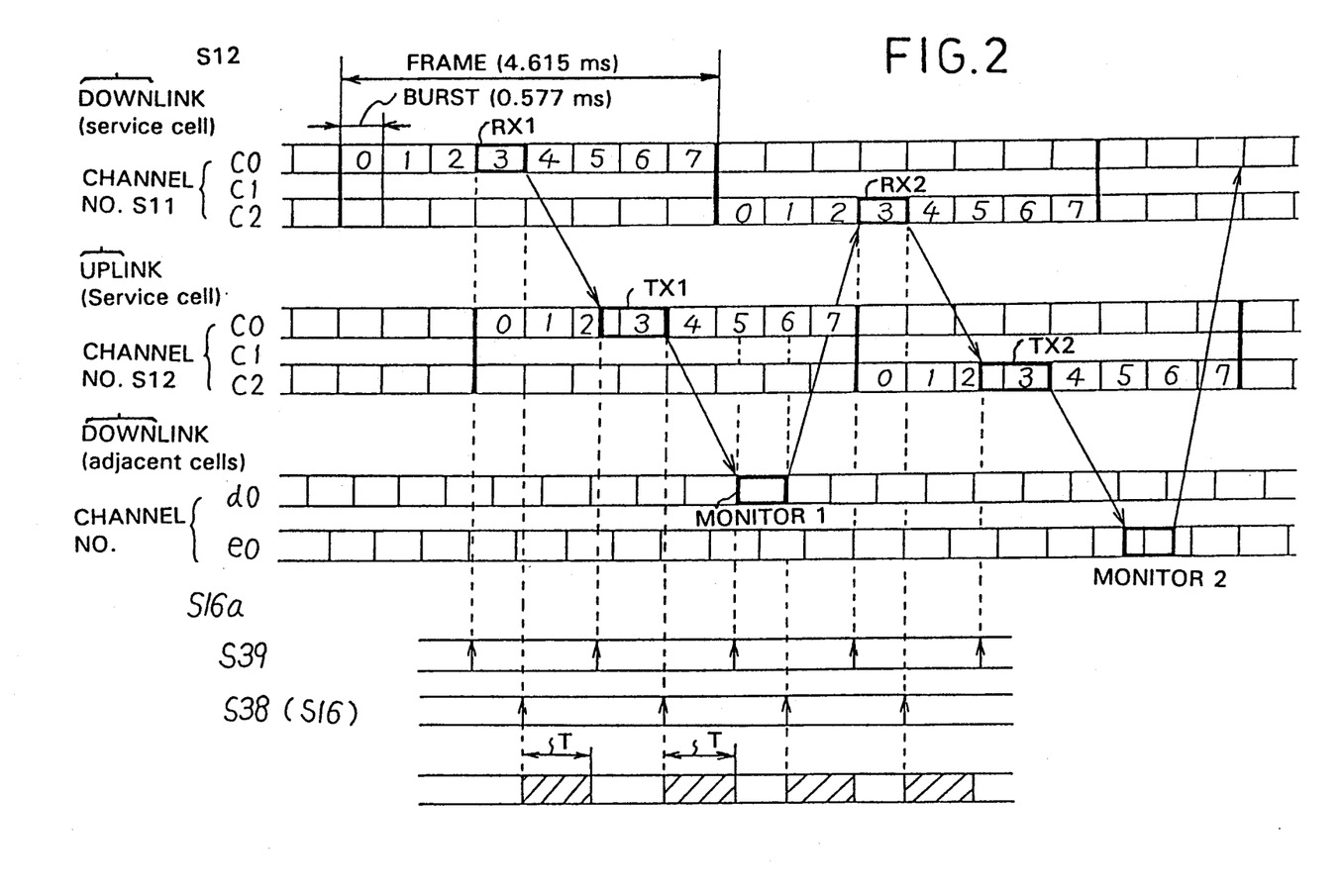
FIG. 2 is a timing chart illustrating a frequency hopping operation of the transceiver shown in FIG. 1.

A frequency hopping operation in the transceiver portion shown in FIG. 1 will be described with reference to FIG. 1 as well as FIG. 2. Describing, first, a TDMA signal, it is assumed that the transceiver portion 10 can use, in a service cell associated with a current position of a vehicle mounting the transceiver portion 10, channels c0, c1 and c2 as a downlink frequency channel from the base station and the same channels c0, c1 and c2 as an uplink frequency channels to the base station. It should be noted that the uplink frequency and the downlink frequency are different even though the same frequency channel may be used therefor. Frequency channels d0 and e0 for a plurality of adjacent cells are displayed as monitor channels for monitoring field intensity. A switching sequence between the transmitting frequency channel and the receiving frequency channel, that is, a frequency hopping sequence, is sent from the base station through the control channels (the receiving signal S12 of the receiving portion 4 and the control signal S17b) to the control portion 6 prior to an opening of a communications channel and the control portion 6 stores the frequency hopping sequence. According to the GSM standards, one TDMA frame (1 frame=4.615 ms) is composed of 8 bursts (1 burst=0.577 ms).

First, the receiving signal S12 is supplied from the base station through the third burst of the c0 channel of the downlink to the receiving portion 4 (RX1). Then, the transmitting portion 4 sends the transmitting signal S11 through the same channel, the same frame and the same burst of the uplink (TX2). A burst of the uplink is set such that it is delayed from a corresponding burst of the downlink by a period corresponding to three bursts. Then, in order to check whether there is any adjacent cell in which it may be possible to obtain a better communications quality than in the present service cell in which the telephone currently exists, the receiving portion 4 monitors the field intensity of the d0 channel of the adjacent cell through the receiving signal S12 at a proper time during 5 bursts period until a communications burst (RX2) of a subsequent frame (Monitor1). After the monitoring of the adjacent cell, the receiving portion 4 receives the receiving signal S12 in the same third burst while frequency is hopped to the channel c2 (RX2). Then, the transmitting portion 3 sends the transmitting signal S11 in the third burst of the same c2 channel (TX2). A subsequent monitoring of field intensity of adjacent cell is performed by monitoring the e0 channel of another cell (Monitor2).

The above-mentioned frequency hopping sequence is performed by switching the frequency of the local oscillating signal S13 supplied from the PLL frequency synthesizer 5 under control of the frequency control signal S16a supplied from the control portion 6. Therefore, the frequency of the local oscillating signal S13 supplied from the PLL frequency synthesizer 5 to the transmitting portion 3 and the receiving portion 4 has to be switched every transmitting and receiving burst. The PLL frequency synthesizer 5 which performs such frequency hopping performs a high-speed, highly frequent frequency switching of the local oscillating signal S13 at least once in one frame period. The transceiver 10 performs a transmitting or receiving operation only during a period corresponding to 3 bursts of 8 bursts comprising one frame and is in a waiting state during the remaining burst period.

Figure 3:
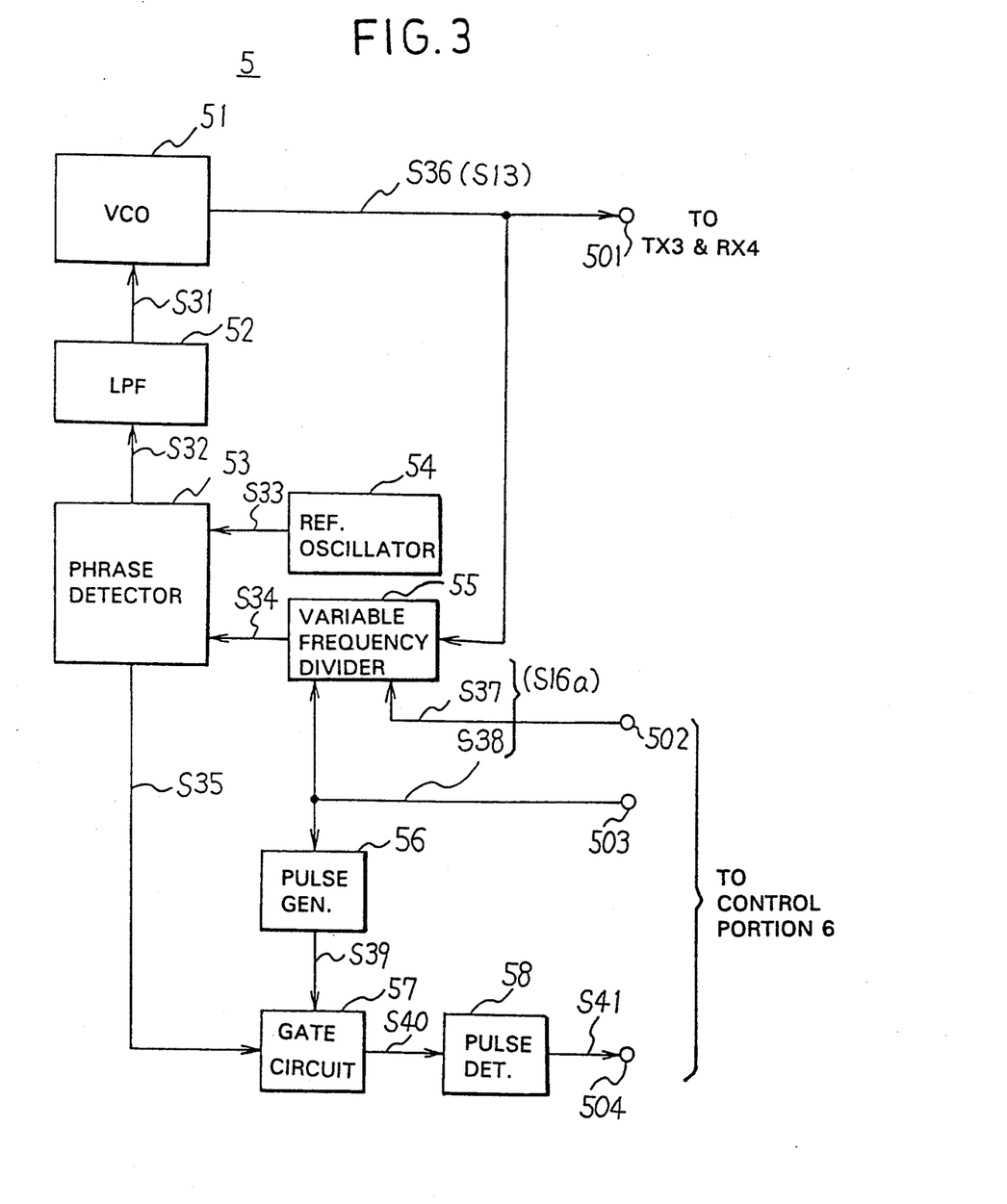
FIG. 3 is a block diagram of a PLL frequency synthesizer comprising a portion of the transceiver shown in FIG. 1.

In FIG. 3, the PLL frequency synthesizer 5 becomes unlocked in every transient time period immediately after each frequency switching of the local oscillating signal S13. Such unlock is inevitable even if the PLL synthesizer 5 operates normally. Thus, the PLL frequency synthesizer 5 performs the frequency switching during the waiting period of the transceiver 10 to prohibit the generation of an unlock alarm for phase unlock during the transient period. The control signal S16a instructing the PLL synthesizer 5 to perform the frequency switching is composed of a dividing data signal S37 for assigning a frequency of the local oscillating signal and a strobe signal S38 for activating the signal S37. The dividing data signal S37 is supplied from the control portion 6 simultaneously with the start of burst transmission by the transmitting portion 3 and the start of burst reception by of the receiving portion 4 and the strobe signal S38 is supplied after the above burst transmission and burst reception are complete. The PLL frequency synthesizer 5 responds to the strobe signal S38 to start the frequency switching of the local oscillating signal S13 and is phase unlocked during a transient time determined by the performance thereof. The PLL synthesizer 5 operates to recover the phase locked state until a subsequent burst transmission or burst reception, that is, during the waiting period of the transceiver 10 which corresponds to one burst period or 1.5 burst period and produces the local oscillating signal S13 having a predetermined frequency. On the other hand, the unlock alarm prohibition means prohibits alarm generation over a period T starting from a time point at which the strobe signal S38 is supplied to the PLL synthesizer 5 and ending at an end of a certain tolerance time after the phase lock state is recovered.

The PLL synthesizer 5 comprises a PLL composed of a voltage-controlled oscillator 51 responsive to a control voltage S31 to supply a local oscillating signal S36 having a predetermined frequency to a synthesizer output terminal 501. A variable frequency divider 55 frequency-divides the signal S36 to produce a comparative signal S34 under control of a dividing data signal S37 supplied from a dividing data input terminal 502 for instructing a dividing ratio and as to the strobe signal supplied from a strobe signal input terminal 503 for activating the dividing data signal S37. A reference oscillator 54 supplies a reference signal S33 having a reference frequency to a phase detector 53 which compares in phase, the comparative signal S34 with the reference signal S33 to produce a phase difference signal S32. A low pass filter 52 integrates the phase difference signal S32 to produce the above-mentioned control voltage S31. The local oscillating signal S13 supplied from the PLL synthesizer 5 in FIG. 1 corresponds to the frequency signal S36 and the frequency control signal S16a for controlling the frequency of the local oscillating signal S13 is divided into the dividing data signal S37 and the strobe signal S38.

When the PLL synthesizer 5 is in unlock state where there is a phase difference between the comparative signal S34 and the reference signal S33, the phase detector 53 in FIG. 3 outputs a phase difference signal S32 as well as a pulse phase difference detection signal S35 corresponding to the phase difference. The pulse phase difference detection signal S35 is supplied to a gate circuit 57 which produces an output signal S40 whose waveform is the same as that of the signal S35 when it is in an ON state and is zero potential when it is in an OFF state. The output pulse signal S40 is supplied to a pulse detection circuit 58 for converting an alarm of the PLL synthesizer 5 into an alarm output S41 and the pulse detection circuit 58 produces at an alarm terminal 504 of the control portion 6 in FIG. 1 the alarm output S41 as one of the device alarms.

A pulse generator circuit 56 (FIG. 3) composed of a one-shot multivibrator, etc., responds to the strobe signal S38 such as a trigger pulse to produce a gate pulse signal S39 having a constant duration T. Upon the occurrence of the signal S39, the gate circuit 57 is turned OFF. Therefore, the pulse detection circuit 58 does not produce the alarm output S41 to the alarm output terminal 504 during a time period T starting from the time the strobe signal S38 is supplied thereto. The above-mentioned circuit constitutes the unlock alarm prohibition means described with respect to FIG. 1.

The PLL synthesizer 5 shown in FIG. 3 switches the frequency of the frequency signal S36 every input of the dividing data signal S37 and the strobe signal S38 and becomes unlocked in every transient time immediately after each frequency switching of the local oscillating signal S13 even if the PLL synthesizer 5 operates normally. During the unlocked period, however, the generation of an unlock alarm (alarm output S41) is prohibited by the unlock alarm prohibition means composed of the pulse generator circuit 56 and the gate circuit 57.

Therefore, the PLL synthesizer 5 does not provide any alarm as to an unlocking when it operates normally and thus a determination of abnormality is facilitated. By using the PLL synthesizer 5 as the local oscillator of the transceiver shown in FIG. 1 which has the frequency hopping function, there is no generation of an erroneous unlock alarm even if a high-speed, highly frequent switching of frequency is performed.

Figure 4:
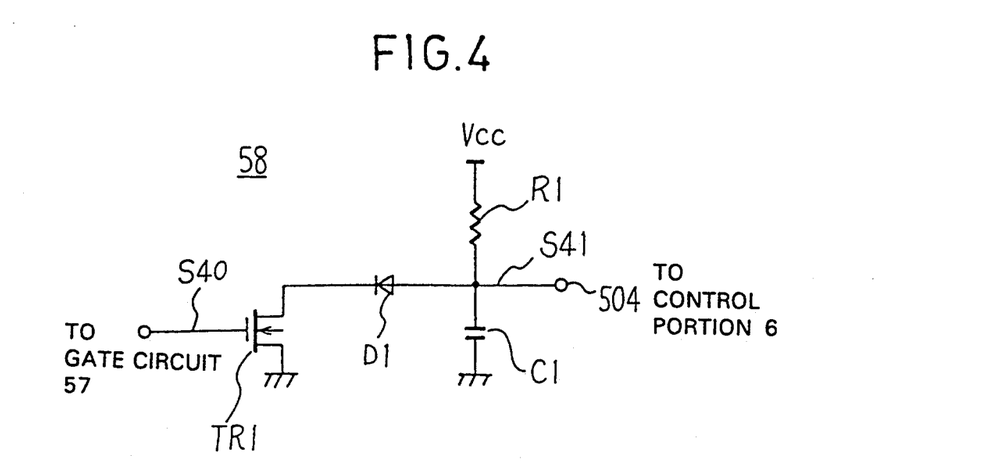
FIG. 4 is a circuit diagram of a pulse detection circuit comprising a portion of the PLL frequency synthesizer shown in FIG. 3.

Referring to FIG. 4 which shows an example of circuit construction of the pulse detection circuit 58 shown in FIG. 3, the latter circuit comprises a field-effect transistor (FET) TR1 having the gate used as the input terminal for the output pulse signal S40 and the source grounded, a diode D1 having a cathode connected to the drain of the FET transistor TR1 and an anode connected to the alarm output terminal 504, a capacitor C1 connected between the anode of diode D1 and ground and a resistor R1 connected between the anode of diode D1 and a positive source Vcc. The pulse detection circuit 58 makes the voltage (alarm output S21) at the alarm output terminal 504 high with a predetermined time constant when the output pulse signal S40 is not supplied and makes it low immediately when the output pulse signal is detected, the low level signal being the unlock alarm indicative of the PLL synthesizer 5 being unlocked.

Figure 5:
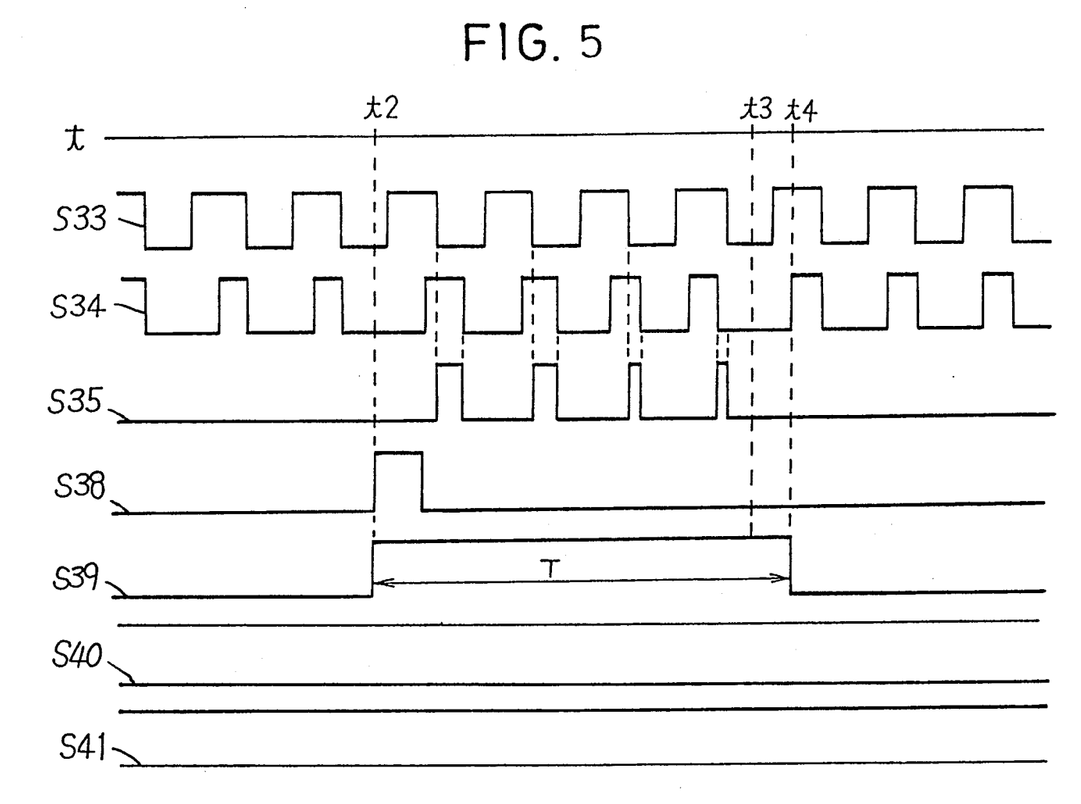
FIG. 5 shows signal waveforms during normal operation of the PLL frequency synthesizer shown in FIG. 3.

Referring to FIG. 3 as well as FIG. 5 showing signal waveforms related to the unlock alarm in the normal operation of the PLL synthesizer 5, the reference oscillator 54 supplies the reference signal S33 having a rectangular waveform. The frequency divider 55 supplies the comparative signal S38 which is a division of the frequency signal S36 (not shown in FIG. 5). when the strobe signal S38 is supplied to the variable frequency divider 55 at a time instance t2, the signal S38 activates the dividing data signal S37 (not shown) which has been input to the divider 55, to thereby change the dividing ratio of the variable frequency divider 55. Thus, because of the change of frequency of the comparative signal S34, the PLL synthesizer 5 becomes unlocked and thus there is provided a phase difference between the reference signal S33 and the comparative signal S34. As a result, the phase difference detection signal S35 in the form of pulses is generated, corresponding to the phase difference between the signals S33 and S34. The phase difference detection signal S35 is indicative of the unlocked state of the PLL synthesizer 5. However, since such an unlocked state is inevitably produced in the initial state of the frequency switching of the frequency signal S36, the operation of the PLL synthesizer 5 is normal. Such unlock state continues until a time instance t3 which is determined by the performance of the PLL synthesizer 5.

On the other hand, the pulse generator circuit 56 shown in FIG. 3 responds to the strobe signal S38 to produce the gate pulse signal S39 whose duration T corresponds to a time period which is a sum of the unlock time starting from the end (time instance t2) of the frequency switching of the PLL synthesizer 5 and ending at a time instance t3 and a certain constant tolerance time starting at the time instance t3 and ending at a time instance t4. That is, a leading edge of the gate pulse signal S39 coincides with a leading edge (t2) of the strobe signal S38 and a trailing edge thereof coincides with the time instance t4 after the time period T from the time instance t2. Thus, when the PLL synthesizer 5 operates normally, the output pulse signal S40 of the gate circuit 57 is always at a low level even if there is provided the phase difference detection signal S35 immediately after the frequency switching of the frequency signal S36. Therefore, the alarm output S41 of the pulse detection circuit 58 is always at a high level, causing the PLL synthesizer 5 not to send any alarm.

The phase detector 53 compares phases of the supplied reference signal S33 and the comparative signal S34 on the basis of the trailing edges thereof and provides the phase difference detection signal S35 and the phase difference signal S32. The phase detector 53 which receives the reference signal S33 and the comparative signal S34 and provides the phase difference signal S32 and the phase difference detection signal S35, which are shown in FIGS. 5 and 6, is integrated in a portion of an LSI chip for a frequency synthesizer, such as μPC2833C (manufactured by NEC Corporation, Tokyo, Japan) and capable of comparing the phases of signals having frequencies up to at least 1 MHz.

Figure 6:
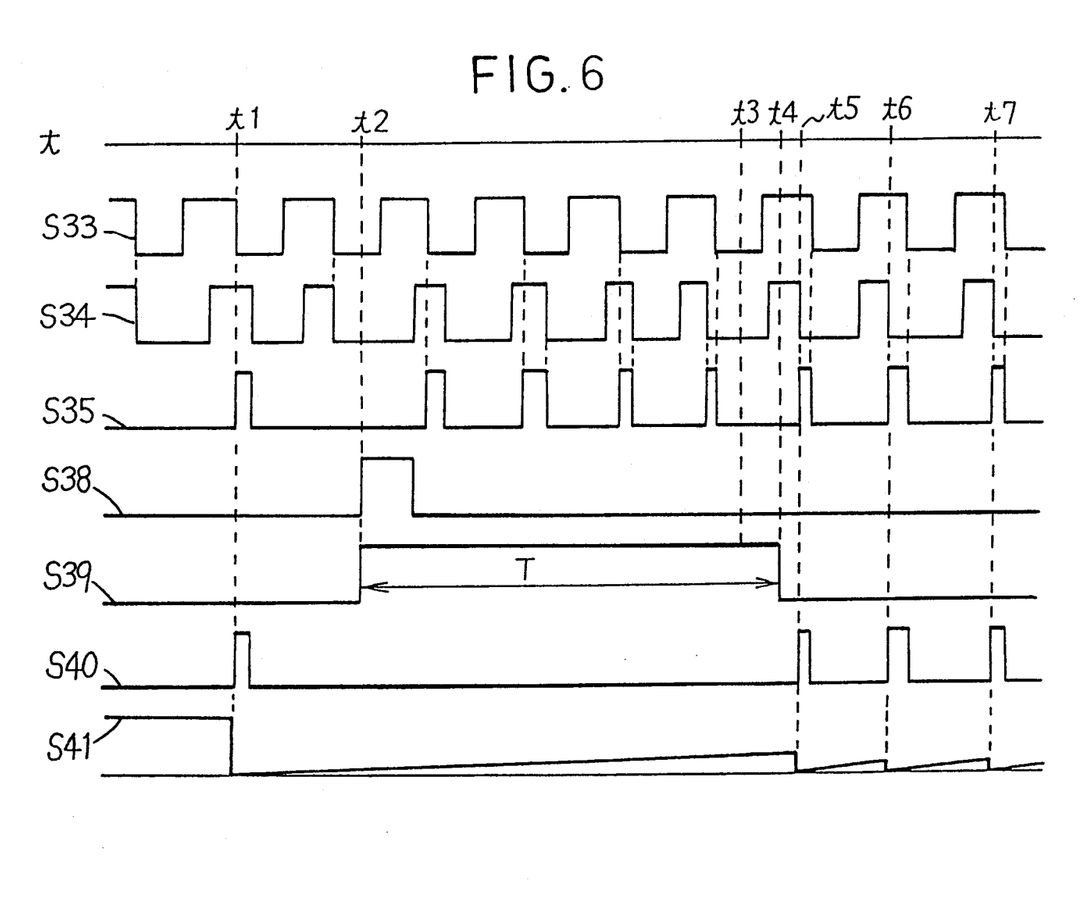
FIG. 6 shows signal waveforms during abnormal operation of the PLL frequency synthesizer shown in FIG. 3.

Reference is now made to FIG. 3 as well as FIG. 6 which shows signal waveforms related to the unlock alarm during an abnormal operation of the PLL synthesizer 5 where there is an unlock state generated outside the frequency switching period of the frequency signal S36.

The phase detector 53 produces the phase difference detection signal S35 at time instances t1, t5, t6 and t7 in a time period outside of the normal initial unlock period T from t2 to t4 of the PLL synthesizer 5. Therefore, the PLL synthesizer 5 is operating abnormally. Since the pulse generator circuit 56 opens the gate circuit 57 in a time other than the period T during which the gate pulse S39 is produced in response to the strobe signal S38, it outputs the phase difference detection signals S35 at the time instances t1, t5, t6 and t7 as the output pulse signal S40. When the output pulse signal S40 is supplied to the pulse detection circuit 58, the alarm output S41 produced at the alarm output terminal 504 immediately becomes a low level, indicating an alarm generating state of the PLL synthesizer 5.

As described hereinbefore, the PLL synthesizer according to the present invention, when applied to a transceiver, prohibits sending of an unlock alarm during the initial unlock period immediately after the frequency switching. Therefore, according to the present invention, in a transceiver in which a transmitting signal frequency and a receiving signal frequency are switched at high-speed highly frequently so that it is adaptable to the TDMA communication system with frequency hopping, it is possible to prohibit generation of any unlock alarm during a normal unlock period immediately after a frequency switching of a PLL synthesizer and thus it is possible to distinguish between a true unlock state, requiring generation of an alarm and a normal unlock state (no alarm), eliminating any obstacle to communication.

Although the present invention has been described with reference to specific embodiments, this description is not meant to be construed in a limiting sense. Various modifications of the disclosed embodiments, as well as other embodiments of the present invention, will become apparent to persons skilled in the art upon reference to the description of the present invention. It is, therefore, contemplated that the appended claims will cover any modifications or embodiments as fall within the scope of the present invention.

What is claimed is:

1. A radio transceiver comprising:
   transmitting means for transmitting a first radio frequency carrier modulated with an information signal;
   receiving means for receiving a second radio frequency carrier modulated with an information signal;
   frequency synthesizer means including a phase locked loop for supplying a local oscillating signal having frequencies related in a predetermined manner to said first frequency and said second frequency, the local oscillating signal being supplied to said transmitting means and said receiving means;
   alarm means responsive to an alarm control signal for providing a device alarm;
   frequency control means for controlling said transmitting means, said receiving means and said synthesizer such that frequencies of said first radio frequency carrier and said second radio frequency carrier are switched; and
   alarm control means for supplying said alarm control signal;
   wherein said transmitting means and said receiving means comprise means for transmitting and receiving said first radio frequency carrier and said second radio frequency carrier respectively in the form of bursts by ON/OFF controlling of said first radio frequency carrier and said second radio frequency carrier;
   and wherein said frequency synthesizer further comprises:
   frequency switching means responsive to a frequency control signal from said frequency control means to switch a frequency of said local oscillating signal;
   unlock state generation means responsive to an unlock state of said phase locked loop for supplying an unlock state signal to said alarm control means; and alarm prohibition means responsive to said frequency control means for prohibiting said alarm control means from generating said alarm control signal during a predetermined time immediately after a frequency switching of said first radio frequency carrier and said second radio frequency carrier.

2. The transceiver claimed in claim 1, wherein said frequency control signal comprises:
   a frequency assigning signal for assigning the frequency of said local oscillating signal; and
   a strobe signal supplied after said frequency assigning signal to activate said frequency assigning signal.

3. The transceiver claimed in claim 2, wherein said alarm prohibition means comprises means for prohibiting said alarm control signal generation starting in response to said strobe signal.

4. The transceiver claimed in claim 1, wherein said transceiver is a radio transceiver of a time division multiple access (TDMA) system capable of selectively setting timing of said first radio frequency carrier and said second radio frequency carrier going to an ON state and the frequencies of said carriers, and wherein said predetermined time is shorter than a time during which said first radio frequency carrier and said second radio frequency carrier are not in an ON state.

5. A radio transceiver including a transmitting means for transmitting a first radio frequency carrier modulated with an information signal to be transmitted through an antenna, a receiving means for receiving a second radio frequency carrier modulated with an information signal to be received through said antenna, a frequency synthesizer, including a phase locked loop for supplying local oscillating signals having frequencies related in a predetermined manner to said first frequency and said second frequency, the local oscillating signals being supplied to said transmitting means and said receiving means, alarm means responsive to an alarm control signal for providing a device alarm, frequency control means for controlling said transmitting means, said receiving means and said synthesizer such that frequencies of said first radio frequency carrier and said second radio frequency carrier are switched and alarm control means for supplying said alarm control signal;
   said transmitting means and said receiving means comprising transceiver means for transmitting and receiving said first radio frequency carrier and said second radio frequency carrier respectively in the form of bursts by ON/OFF controlling of said first radio frequency carrier and said second radio frequency carrier;
   said frequency synthesizer comprising:
   a voltage controlled oscillator responsive to a control voltage to produce a local oscillating signal having an arbitrary frequency;
   variable frequency divider means responsive to a dividing data signal from said frequency control means, said dividing data signal being indicative of a frequency dividing ratio, and a strobe signal for activating said dividing data signal to frequency-divide said local oscillating signal thereby to produce a comparative signal;
   a reference oscillating means for producing a reference signal having a reference frequency;
   phase detection means responsive to a phase difference between said comparative signal and said reference signal to produce a phase difference signal and an oscillator control signal;
   low-pass filter means for integrating said oscillator control signal and supplying said oscillatory control signal to said voltage controlled oscillating means as said control voltage;
   unlock alarm generation means for producing an unlock alarm from said phase difference signal; and
   unlock alarm prohibition means for controlling said unlock alarm generation means to prohibit generation of said unlock alarm for a predetermined time, said unlock alarm prohibition means comprising means for prohibiting generation of said unlock alarm starting in response to said strobe signal.

6. The transceiver claimed in claim 5, wherein said transceiver comprises a radio transceiver of a time division multiple access (TDMA) system capable of selectively setting timing of said first radio frequency carrier and said second radio frequency carrier going to an ON state and the frequencies of said carriers, and wherein said predetermined time is shorter than a time during which said first radio frequency carrier and said second radio frequency carrier are not in an ON state.

7. A radio transceiver including a transmitting means for transmitting a first radio frequency carrier modulated with an information signal to be transmitted through an antenna, a receiving means for receiving a second radio frequency carrier modulated with an information signal to be received through said antenna, a frequency synthesizer, including a phase locked loop for supplying local oscillating signals having frequencies related in a predetermined manner to said first frequency and said second frequency, the local oscillating signals being supplied to said transmitting means and said receiving means, alarm means responsive to an alarm control signal for providing a device alarm, and frequency control means for controlling said transmitting means, said receiving means and said synthesizer such that frequencies of said first radio frequency carrier and said second radio frequency carrier are switched;
   said transmitting means and said receiving means comprising transceiver means adaptable to a time division multiple access (TDMA) system for transmitting and receiving said first radio frequency carrier and said second radio frequency carrier respectively in the form of bursts by ON/OFF controlling of said first radio frequency carrier and said second radio frequency carrier;
   said frequency synthesizer comprising:
   a voltage controlled oscillator responsive to a control voltage to produce a local oscillating signal having an arbitrary frequency;
   variable frequency divider means responsive to a dividing data signal from said frequency control means, said dividing data signal being indicative of a frequency dividing ratio, and a strobe signal for activating said dividing data signal to frequency-divide said local oscillating signal thereby to produce a comparative signal;
   a reference oscillating means for producing a reference signal having a reference frequency;
   phase detection means responsive to a phase difference between said comparative signal and said reference signal to produce a phase difference signal and an oscillator control signal;
   low-pass filter means for integrating said oscillator control signal and for supplying said oscillator control signal to said voltage controlled oscillating means as said control voltage;

pulse generator means responsive to said strobe signal to produce a gate pulse signal having a predetermined duration;

gate means responsive to said gate pulse signal to gate said phase difference signal thereby to produce an output signal; and pulse detection means responsive to said output signal to produce an unlock alarm signal comprising said alarm control signal, said unlock alarm signal being prohibited for a predetermined time after said switching of said radio frequency carriers.

8. The transceiver claimed in claim 7, wherein said unlock alarm signal produced by said pulse detection means comprises a high level with a predetermined time constant when said output signal is not detected and changes state to a low level when said output signal is detected.

9. The transceiver claimed in claim 7, wherein said pulse detection means comprises:
 an FET having a gate as an input terminal for said output signal and a source connected to ground;
 a diode having a cathode connected to a drain of said FET and an anode as an output terminal for said unlock alarm signal;
 a capacitor connected between said anode of said diode and said ground; and
 a resistor connected between a positive source and said anode of said diode.

10. A frequency synthesizer including a phase locked loop and producing a high frequency output having a frequency variable according to a frequency control signal, said synthesizer comprising:
 unlock alarm generation means responsive to an unlocked state of said phase locked loop to produce an unlock alarm signal; and
 unlock prohibition means for prohibiting generation of said unlock alarm signal for a predetermined time immediately after a frequency switching caused by said frequency control signal.

11. The synthesizer claimed in claim 10, wherein said frequency control signal comprises:
 a frequency assigning signal for assigning a frequency of a local oscillating signal of a local oscillator of said phase locked loop; and
 a strobe signal supplied after said frequency assigning signal to activate said frequency assigning signal.

12. The synthesizer claimed in claim 11, wherein the unlock prohibition means comprises means for prohibiting generation of said unlock alarm starting in response to said strobe signal.

13. A synthesizer comprising:
 a voltage controlled oscillator responsive to a control voltage to produce a local oscillating signal having an arbitrary frequency;
 variable frequency divider means responsive to a dividing data signal from a frequency control means, said dividing data signal being indicative of a frequency dividing ratio, and a strobe signal for activating said dividing data signal to frequency-divide said local oscillating signal thereby to produce a comparative signal;
 a reference oscillating means for producing a reference signal having a reference frequency;
 phase detection means responsive to a phase difference between said comparative signal and said reference signal to produce a phase difference signal and an oscillator control signal;
 low-pass filter means for integrating said oscillator control signal and supplying said oscillator control signal to said voltage controlled oscillating means as said control voltage;
 unlock alarm generation means for producing an unlock alarm from said phase difference signal; and
 unlock alarm prohibition means for controlling said unlock alarm generation means to prohibit generation of said unlock alarm for a predetermined time, said unlock alarm prohibition means comprising means for prohibiting the generation of said unlock alarm starting in response to said strobe signal.

14. A synthesizer comprising:
 a voltage controlled oscillator responsive to a control voltage to produce a local oscillating signal having an arbitrary frequency;
 variable frequency divider means responsive to a dividing data signal from a frequency control means, said dividing data signal being indicative of a frequency dividing ratio, and a strobe signal for activating said dividing data signal to frequency-divide said local oscillating signal thereby to produce a comparative signal;
 a reference oscillating means for producing a reference signal having a reference frequency;
 phase detection means responsive to a phase difference between said comparative signal and said reference signal to produce a phase difference signal and an oscillator control signal;
 low-pass filter means for integrating said oscillator control signal and supplying said oscillator control signal to said voltage controlled oscillating means as said control voltage;
 pulse generator means responsive to said strobe signal to produce a gate pulse signal having a predetermined duration;
 gate means responsive to said gate pulse signal to produce an output pulse signal; and
 pulse detection means responsive to said output pulse signal to produce an unlock alarm signal indicative of an unlock state of said comparative signal produced by said variable frequency divider means with said reference signal produced by said reference oscillating means, said unlock alarm signal being prohibited for a predetermined time after said switching of said radio frequency carriers.

15. The synthesizer claimed in claim 14, wherein said unlock alarm signal produced by said pulse detection means comprises a high level with a predetermined time constant when said output pulse signal is not detected and changes state to a low level immediately when said output pulse is detected.

16. The synthesizer claimed in claim 15, wherein said pulse detection means comprises:
 an FET having a gate as an input terminal for said output pulse signal and a source connected to ground;
 a diode having a cathode connected to a drain of said FET and an anode as an output terminal for said unlock alarm signal;
 a capacitor connected between said anode of said diode and said ground; and
 a resistor connected between a positive source and said anode of said diode.

17. The transceiver claimed in claim 1, wherein the alarm means comprises an alarm display means.

18. The transceiver claimed in claim 5, wherein the alarm means comprises an alarm display means.

19. The transceiver claimed in claim 7, wherein the alarm means comprises an alarm display means.

20. A radio transceiver comprising:

transmitting means for transmitting a first radio frequency carrier modulated with an information signal;

receiving means for receiving a second radio frequency carrier modulated with an information signal;

frequency synthesizer means including a phase lock loop for supplying a local oscillating signal having switchable frequencies related to the first frequency and the second frequency, the local oscillator signal being supplied to said transmitting means and said receiving means;

frequency control means for controlling said transmitting means, said receiving means and said synthesizer such that frequencies of said first radio frequency carrier and said second radio frequency carrier are switched;

the frequency synthesizer further comprising:

frequency switching means responsive to a frequency control signal from said frequency control means for switching a frequency of said local oscillating signal;

means responsive to an unlock state of said phase lock loop for supplying an unlock state signal; and means responsive to said unlock state signal for prohibiting generation of an alarm signal indicative of an unlock state of said phase lock loop during a predetermined time immediately after a frequency switching of at least one of said first radio frequency carrier and said second radio frequency carrier.

21. A method of controlling generation of an alarm signal indicative of an unlock state of a phase locked loop used in a frequency synthesizer, comprising the steps of:

supplying a local oscillating signal from said frequency synthesizer to a receiver and transmitter;

switching, in response to a first control signal, the frequency of said local oscillating signal;

supplying, in response to an unlock state of said phase locked loop, an unlock state signal; and prohibiting, in response to a second control signal, generation of said alarm signal indicative of the unlock state of said phase locked loop during a predetermined time immediately after the frequency switching of said local oscillating signal.

* * * * *